United States Patent

Kawamura et al.

[11] Patent Number: 5,856,060
[45] Date of Patent: Jan. 5, 1999

[54] IMAGE FORMING MATERIAL AND IMAGE FORMING METHOD EMPLOYING THE SAME

[75] Inventors: Tomonori Kawamura; Masataka Takimoto; Ai Katsuda; Katsuji Kondo, all of Hino, Japan

[73] Assignee: Konica Corporation, Japan

[21] Appl. No.: 811,048

[22] Filed: Mar. 4, 1997

[30] Foreign Application Priority Data

| Mar. 7, 1996 | [JP] | Japan | 8-050046 |
| Sep. 30, 1996 | [JP] | Japan | 8-259128 |

[51] Int. Cl.$^6$ .............. G03F 7/34; G03F 7/36; G03F 7/11
[52] U.S. Cl. .......... 430/201; 430/200; 430/253; 430/273.1; 430/961; 430/964
[58] Field of Search .............. 430/200, 201, 430/964, 961, 273.1, 253

[56] References Cited

U.S. PATENT DOCUMENTS

| 4,588,674 | 5/1986 | Stewart et al. | 430/201 |
| 5,429,909 | 7/1995 | Kaszczuk et al. | 430/201 |
| 5,501,938 | 3/1996 | Ellis et al. | 430/201 |
| 5,691,103 | 11/1997 | Takeyama et al. | 430/964 |
| 5,693,447 | 12/1997 | Takeyama et al. | 430/201 |

FOREIGN PATENT DOCUMENTS

| 0160396 | 6/1985 | European Pat. Off. |
| 0573092 | 8/1993 | European Pat. Off. |
| 0582001 | 9/1994 | European Pat. Off. |
| 9303928 | 4/1993 | WIPO |

*Primary Examiner*—Richard L. Schilling
*Attorney, Agent, or Firm*—Jordan B. Bierman; Bierman, Muserlian and Lucas

[57] ABSTRACT

An image forming material is disclosed which comprises a support and provided thereon, an image forming layer and an image protective layer in that order, the image forming layer containing a colorant and a first binder resin, and the image protective layer containing fine particles in an amount of 2 to 150 mg/M$^2$ and a second binder resin and having a thickness of 0.03 to 1.0 μm, wherein an image is formed by exposing the material to a high density energy light to reduce adhesion between the image forming layer and the support and then removing the image forming layer at exposed portions.

7 Claims, 2 Drawing Sheets

IMAGE FORMING MATERIAL AND IMAGE FORMING METHOD EMPLOYING THE SAME

FIELD OF THE INVENTION

The present invention relates to an image forming material, a manufacturing method of the same and an image forming method using the same which provides high sensitivity and an image with excellent durability and high density.

BACKGROUND OF THE INVENTION

The recording method is well known which comprises the steps of exposing to a high density energy light such as a laser light, an image forming material, whereby a part of the material is deformed, released, burnt or evaporated and removed. This method is a dry process in which a processing solution containing a chemical is not employed, and only the exposed portions are melt-deformed, released or evaporated, which has an advantage resulting in high contrast. This method is used for an optical recording material such as a resist material, an optical disc or an image forming material obtaining a visual image. This image forming method hereinafter is defined as an image forming method according to abrasion.

Such an image forming method according to abrasion is different from a heat-fusible image transfer image forming method in the following points: The heat-fusible image transfer image forming method comprises the steps of providing an image forming layer on a support, the image forming layer containing a colorant and a thermoplastic resin or wax having a low melting or softening point; imagewise heating the image forming layer directly or indirectly through the support to the melting or softening point or more, whereby adhesion between the image forming layer and the support is reduced; and transferring the image forming layer at heated portions to an image receiving sheet. In this method, when the heated image forming layer is cooled before transfer, the adhesion before the heating is recovered, which means a reversible heat property change. On the other hand, the image forming method according to abrasion shows an irreversible change that the image forming layer is destroyed or deformed.

Regarding the image forming method according to abrasion, Japanese Patent O.P.I. Publication Nos. 59-5447, 59-10563, and 62-115153 disclose a method in which a binder resin is photodegraded by a pattern exposure to form a resist, Japanese Patent O.P.I. Publication Nos. 55-132536, 57-27788, and 57-103137 disclose a method in which a thin inorganic compound layer provided by evaporation-deposit is exposed to record information by melt-deformation, Japanese Patent O.P.I. Publication Nos. 64-56591, 1-99887, and 6-40163 disclose a method in which a colored binder resin is removed by light heat conversion to record information, and U.S. Pat. No. 4,245,003 discloses an image forming material comprising an image forming layer containing graphite or carbon black.

In PCT Patent No. 4-506709/1992, Japanese Patent O.P.I. Publication No. 6-18290/1994, and U.S. Pat. Nos. 5,156,938, 5,171,650 and 5,256,506 is disclosed an image forming material comprising a light heat converting substance capable of converting absorbed laser light energy to heat energy and a binder capable of being degraded due to heat.

In PCT Patent No. 4-506709/1992, Japanese Patent O.P.I. and U.S. Pat. Nos. 5,156,938, 5,171,650 and 5,256,506 is disclosed an image forming method which receives, on an image receiving material, an image forming layer to have been degraded and released. According to these, the scatter in air of fine powder of the image forming layer, which is produced due to abrasion, is solved.

However, the conventional image receiving material itself has an effect restraining the above abrasion phenomena, and in order to obtain an image with sufficient density and resolving power, high exposure energy is necessary, resulting in problems that an image forming apparatus is large-sized and increased in its manufacturing cost.

Further, in Japanese Patent O.P.I. Publication Nos. 4-327982/1992 and 4-327983/1992 is disclosed an image forming method comprising the steps of (a) exposing to a laser light an image forming material comprising a support and provided thereon, a light heat converting layer, which is also an evaporation layer, containing a light heat converting substance, and a colorant layer in that order, (b) superposing an image receiving material having a heat fusible layer on the image forming layer, and (c) peeling the image receiving material from the image forming layer to form an image. However, this image receiving material has a problem in that on peeling the image receiving material, a part of a substance in the the fusible layer remains with abraded image forming layer on the support, resulting in stain in the image forming material. Further, there are problems in that image defects such as scratches occur on the surface of the image forming materials after forming an image, which occur due to friction among them, or components in the image forming layer are dissolved in an organic solvent contained in film cleaner for graphic arts film.

As disclosed in Japanese Patent O.P.I. Publication No. 60-255491, a technique providing an image protective layer on an image forming layer is known in order to enhance image durability. When the image forming layer is thick, the image durability is enhanced but high exposure energy for recording an image is necessary and resolving power is lowered. Further, there are limitations that when an image forming layer coating solution is coated on the image forming layer coated on a support employing an image forming layer coating organic solvent solution, the image forming layer coating solution must be a water soluble resin solution or a water dispersible resin dispersion. This is disadvantageous in selecting a resin for the image protective layer.

As disclosed in Japanese Patent Publication No. 7-25202 (support/recording layer/image protective layer), there is description of a technique employing a coating solution in which a thermoplastic resin is dissolved in a specific solvent whereby solvent resistance is improved. However, this technique does not solve a problem of sensitivity lowering.

SUMMARY OF THE INVENTION

The present invention has been made to overcome the above problems. An object of the invention is to provide an image forming material, a preparing method of the same or an image forming method using the same, which gives high sensitivity, a high optical density, no staining and high resolving power.

DETAILED DESCRIPTION OF THE INVENTION

Figure 1A:
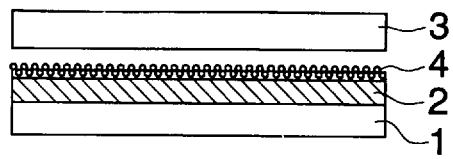
FIGS. 1A, 1B, 1C, 1A' and 1B' show embodiments of the image forming material in the invention.

The above object of the invention can be attained by the followings:

1. an image forming material comprising a support and provided thereon, an image forming layer and an image protective layer in that order, the image forming layer containing a colorant and a first binder resin, and the image protective layer containing fine particles in an amount of 2 to 150 mg/m² and a second binder resin and having a thickness of 0.03 to 1.0 μm, wherein an image is formed by exposing the material to a high density energy light to reduce adhesion between the image forming layer and the support and then removing the image forming layer at exposed portions, or the image forming material above wherein an image receiving material is further provided on the image protective layer, a peeling force between the image receiving material and image protective layer is 1–50 gf/cm when measured by a 180° peeling method according to JIS 2107 (JIS Z 0237), the fine particles have an average particle size r of 0.3 to 4.5 μm, or the average particle size r and the thickness d of the image protective layer satisfy inequality r≧d, 2. an image forming material comprising a support and provided thereon, an image forming layer, an image protective layer and an image receiving material in that order, the surface of the image protective layer on the image receiving material having a smoothter value of 1 to 200 mmHg at 23° C. and 55% RH, wherein an image is formed by exposing the image forming material to a high density energy light to reduce adhesion between the image forming layer and the support, and then removing the image forming layer at exposed portions, 3. the image forming material of 1 or 2 above, wherein the image forming layer is subjected to calender treatment, the image protective layer is hardened with a hardener, the image forming layer contains metal atom-containing fine particles, the support is consisting of a styrene homopolymer or copolymer having a syndiotactic structure, or the image protective layer contains a resin having a glass transition of 80° to 200° C. as a binder, 4. an image forming method comprising the steps of exposing the image forming material described above to a high density energy light to reduce adhesion between the image forming layer and the support, and then removing the image forming layer at exposed portions, 5. a method for manufacturing the image forming material described above, the method comprising the step of coating an image forming layer coating solution on the support to an image forming layer and then coating an image protective layer coating solution on the image forming layer, wherein the image forming layer coating solution and image protective layer coating solution have at least one common solvent, the image forming layer is hardened, or the image protective layer coating solution has a resin having a functional group capable of being cross-linked with a cross-linking agent which is contained in the image forming layer coating solution, or 6. an image forming material comprising a support and provided thereon, an image forming layer and an image protective layer in that order, the surface of the image protective layer having a smoothter value of 1 to 200 mmHg at 23° C. and 55% RH, wherein an image is formed by adhering an image receiving material to the image protective layer, exposing the resulting material to a high density energy light to reduce adhesion between the image forming layer and the support and then removing the image forming layer at exposed portions.

The present inventors have found that sensitivity lowering is greatly reduced by incorporating fine particles in an image protective layer of an image forming material or by having a specific surface property in the image protective layer, so that scratch resistance or solvent resistance is improved by making the image protective layer thicker, and have attained the invention by setting specific the relation between the image protective layer thickness and fine particle diameter contained in the image protective layer or by setting specific a smoothter value of the surface of the image protective layer on the image receiving material side. Further, the image protective layer coating solution employing the same solvent composition as the image forming layer coating solution can be coated on the image forming layer hardened with a hardener to form the image protective layer, whereby the present invention provides an image forming material giving an image with high durability and high quality.

The invention will be explained in detail below.

The image forming material in the invention is comprised of an image forming layer, an image protective layer, a support carrying them and an image receiving material.

<Support>

The support includes a resin film such as polyacrylate, polymethacrylate, polyethyleneterephthalate, polybutyleneterephthalate, polyethylenenaphthalate, polycarbonate, polyvinyl chloride, polyethylene, polypropylene, polystyrene, nylon, aromatic polyamide, polyether etherketone, polysulfone, polyether sulfone, polyimide or polyether imide, or a film in which the above two or more resin films are laminated.

The support used in the invention is a support having a transparency of 50% or more to light of a light source, and is preferably a support obtained by orienting resins in the film form and heat-setting in view of dimensional stability. The support may contain a filler such as titanium oxide, zinc oxide, barium sulfate or calcium carbonate, a colorant or an anti-static agent as long as it does not inhibit the effects of the invention. The thickness of the support in the invention is preferably 10 to 500 μm, and more preferably 25 to 250 μm.

In the invention, when polystyrene is used as the support, a film comprising as a main component a syndiotactic polystyrene (hereinafter referred to also as SPS) described below shows excellent dimensional stability. The film comprising as a main component a syndiotactic polystyrene herein referred to means a film comprising polystyrene having a stereo regularity, a syndiotactic structure, in which phenyl groups or substituted phenyl groups as a side chain are alternatively positioned on opposite sides to the polystyrene main chain, and a film comprising polystyrene having mainly recemo chains in the polystyrene structure or a composition containing the polystyrene. This polystyrene, if a homopolymer, can be synthesized by polymerization disclosed in Japanese Patent O.P.I. Publication No. 62-117708/1987, and another styrene copolymer can be synthesized by polymerization disclosed in Japanese Patent O.P.I. Publication Nos. 1-46912/1989 and 1-178505/1989.

Tacticity is measured according to a nuclear magnetic resonance method using a carbon thirteen ($^{13}$C-NMR method). This tacticity measured according to a nuclear magnetic resonance method can be represented by the presence of successive plural styrene units, for example, two successive units called a diad, three successive units called a triad, and five successive units called a pentad. The polystyrene having mainly a syndiotactic structure in the invention has ordinarily not less than 75%, preferably not less than 85% of a recemi diad, or not less than 60%, preferably not less than 75% of a recemi triad, or not less than 30%, preferably not less than 50% of a recemi pentad.

The monomer capable of forming the syndiotactic styrene polymer which the composition contains includes styrene, an alkyl styrene such as methyl styrene, a halogenated or halogenated alkyl styrene such as chlorostyrene, chloromethylstyrene, an alkoxy styrene and vinylbenzoate. The alkylstyrene-styrene copolymer is especially preferable copolymer in obtaining a film having a thickness of not less than 50 μm.

The polystyrene having a syndiotactic structure can be obtained by polymerizing the above monomer in the presence of a catalyst such as a composition containing a transition metal compound and aluminoxane or a composition containing a transition metal compound and a compound capable of forming an ionic complex on reaction with the transition metal compound disclosed in Japanese Patent O.P.I. Publication No. 5-320448, p. 4 to 10.

In order to manufacture the styrene polymer, the above styrene monomer is purified and then polymerized in the presence of the above described catalyst. The polymerization method, polymerization conditions (polymerization temperature, polymerization time), a solvent for polymerization may be appropriately selected. Ordinarily, polymerization is carried out at −50° to 200° C., preferably 30° to 100° C., for 1 second to 10 hours, preferably 1 minute to 6 hours. The polymerization method includes a slurry polymerization, a solution polymerization, a bulk polymerization, and an air polymerization, and may be a continuous or discontinuous polymerization. The polymerization solvent includes an aromatic hydrocarbon such as benzene, toluene, xylene or ethylbenzene, an aliphatic hydrocarbon such as cyclopentane, hexane, heptane or octane or their combination. The ratio, monomer/solvent (by volume) can be arbitrarily selected. The control of the molecular weight or composition of a polymer obtained can be conducted according to a conventional method. The molecular weight can be controlled by hydrogen, polymerization temperature or a monomer concentration.

The above described monomer may be copolymerized with another monomer, as long as the effect of the invention is not inhibited.

The weight average molecular weight of SPS used for film making has preferably not less than 10,000, more preferably not less than 30,000. When the molecular weight is less than 10,000, a film having excellent mechanical strength and heat resistance can not be obtained. The upper limit of the molecular weight is not limited, but a film having a molecular weight of 1,500,000 or more has a possibility of breakage due to an increase of orientation tension. The weight average molecular weight of SPS in the invention is preferably 10,000 to 3,000,000, and especially preferably 30,000 to 1,500,000.

The molecular weight distribution (number average molecular weight/weight average molecular weight) is preferably 1.5 to 8. The molecular weight distribution can be adjusted also by mixing polymers having a different molecular weight.

It is preferable that SPS pellets are preferably dried at 120° to 180° C. for 1 to 24 hours under vacuum condition or under an ordinary pressure atmosphere of air or an inactive air such as nitrogen and then a SPS film is manufactured. The moisture content of the pellets used for manufacturing a film is not limited, but is preferably 0.05% or less, more preferably 0.01% or less, and still more preferably 0.005% or less, in minimizing mechanical strength deterioration due to hydrolysis.

The support may contain inorganic fine particles, antioxidants, UV absorbers, antistatic agents, colorants, pigment or dyes.

For the extruding method at the time of manufacturing the film, any conventional method may be applied. For example, a extrusion method by the use of a T-die is preferable. The syndiotactic polystyrene pellets are melted at 280° to 350° C. and extruded, and cooled and solidified on a casting roll while applying electrostatic potential to obtain an unoriented film. Next, this unoriented film is be oriented biaxially. For the method of orientation, a conventional method, for example, including one after another biaxial orientation method in which a longitudinal orientation and a lateral orientation are carried out in this order, one after another biaxial orientation method in which a lateral orientation and a longitudinal orientation are carried out in this order, a lateral-longitudinal-lateral orientation method, a longitudinal-lateral-longitudinal orientation method, a longitudinal-longitudinal-lateral orientation method or simultaneous biaxial orientation method may be used. The method may optionally be selected according to desirable characteristics such as mechanical strength and dimensional stability.

Generally, one after another biaxial orientation method in which a longitudinal orientation and a lateral orientation are carried out in this order is preferable, wherein the longitudinal and lateral orientation magnifications are 2.5 to 6 times and the temperature at the longitudinal orientation, although the temperature depends on the glass transition temperature (Tg), is preferably from Tg plus 10° C. to Tg plus 50° C. The orientation temperature is preferably 110° to 150° C. in the syndiotactic polystyrene film. The lateral orientation temperature is preferably 115° to 160° C. which is higher than the longitudinal orientation temperature. The oriented film is then heat set. The heat set temperature optionally varies according to the usage. The heat set temperature is 150° to 270° C. in view of dimensional stability.

The heat set time is not specifically limited, but is ordinarily 1 second to 2 minutes. At heat set treatment, longitudinal or lateral heat relaxation treatment may be optionally carried out.

The heat set film may be sharply cooled and wound around a core. It is preferable in view of anti-curling that after the film is gradually cooled from Tg to a heat set temperature in 0.1 minutes to 1,500 hours and then wound around a core having a large diameter, the resulting material may be further cooled at from 40° C. to Tg at an average cooling speed of −0.01° to −20° C./minute. The heat treatment of from 40° C. to Tg is preferably carried out in a thermostat in 0.1 minutes to 1500 hours during from the winding to emulsion coating.

<Image forming layer>

The image forming layer contains a colorant and a binder carrying the colorant.

The colorant used in the invention is not specifically limited, as long as the colorant absorbs a light emitted from a light source.

The colorant includes inorganic pigment, organic pigment and organic dyes.

The inorganic pigment includes titanium dioxide, carbon black, zinc oxide, Prussian blue, cadmium sulfide, iron oxide, and chromates of lead, zinc, barium or calcium. The organic pigment includes azo, thioindigo, anthraquinone, anthanthraquinone or triphenedioxazine pigments, but dye pigment, phthalocyanine pigment (copper phthalocyanine or its derivatives), and quinacridone pigment. The organic dyes include acid dyes, direct dyes and dispersing dyes.

When exposure light has a near infrared wavelength, near infrared absorbers as the colorant includes organic compounds such as cyanine, polymethine, azulenium, squalenium, thiopyrylium, naphthoquinone and anthraquinone dyes, and phthalocyanine, azo and thioamide organic metal complexes. The examples thereof are disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589, and 3-103476.

As the colorant, metal atom-containing particles are preferably used in that the invention is markedly effected. When the metal atom-containing particles are used in the image forming layer of the image forming material, sensitivity, resolving power and stainings at exposed portions are greatly improved.

The average particle size of the colorant is preferably 0.01–0.8 $\mu$m, and more preferably 0.02–0.5 $\mu$m. The particle size referred to in the invention means a particle diameter when particles are spherical, but, when particles are shapes other than spheres, it is the diameter of a circle having the same area as their projected area.

The colorant content of the image forming layer is 60 to 95 weight %.

The metal atom-containing particles include metals such as iron, chromium, manganese, cobalt, nickel, copper, zinc, titanium, silver, aluminum, gold and platinum, and their oxides.

The metal atom-containing particles preferably used in the invention include ferromagnetic iron oxide powder, ferromagnetic metal powder, and cubic, tabular powder, and ferromagnetic metal powder is more suitably used.

The ferromagnetic iron oxide includes $\gamma$-$Fe_2O_3$, $Fe_3O_4$, and an intermediate iron oxide thereof, $Fe_xO$ ($1.33 < x < 1.50$).

Examples of the ferromagnetic metal powder include ferromagnetic metal powders such as Fe type, Co type, Fe—Al type, Fe—Al—Ni type, Fe—Al—Zn type, Fe—Al—Co type, Fe—Al—Ca type, Fe—Ni type, Fe—Ni—Al type, Fe—Ni—Co type, Fe—Ni—Zn type, Fe—Ni—Mn type, Fe—Ni—Si type, Fe—Ni—Si—Al—Mn type, Fe—Ni—Si—Al—Zn type, Fe—Ni—Si—Al—Co type, Fe—Al—Si type, Fe—Co—Ni—P type, Fe—Co—Al—Ca, Ni—Co type, and magnetic metal powder whose principal components are Fe, Ni and Co. Of them, Fe type metal powders are preferable, and include Co-containing iron oxides such as Co-containing $\gamma$-$Fe_2O_3$, Co-coated $\gamma$-$Fe_2O_3$, Co-containing $\gamma$-$Fe_3O_4$, Co-coated $\gamma$-$Fe_3O_4$, and Co-containing magnetic $FeO_x$ ($4/3 < x < 3/2$).

In view of corrosion-resistance and dispersibility the preferred are Fe—Al type ferromagnetic metal powders including Fe—Al type, Fe—Al—Ca type, Fe—Al—Ni type, Fe—Al—Zn type, Fe—Al—Co type, Fe—Ni—Si—Al—Co type and Fe—Co—Al—Ca type. Of these powders, the preferable are ferromagnetic powder in which the content ratio of a Fe atom to an Al atom is 100:1 to 100:20 and the content ratio at 100 Å depth of a Fe atom to an Al atom is 30:70 to 70:30 measured through ESCA (electron spectroscopy for chemical analysis) or ferromagnetic powder containing at least one of Fe, Ni, Al, Si, Co and Ca in which the Fe content is 90 atom % or more, the Ni content is 1 to 10 atom %, the Al content is 0.1 to 5 atom %, the Si content is 0.1 to 5 atom %, the Co or Ca content (or the sum content of Co and Ca) is 0.1 to 13 atom %, and the content ratio by the number of atom at 100 Å depth, Fe:Ni:Al:Si:(Co and/or Ca) is 100:(not more than 4):(10 to 60):(10 to 70):(20 to 80), measured through ESCA (electron spectroscopy for chemical analysis).

The ferromagnetic powder is preferably needle-like, and has an average major axial length of 0.05–0.15 $\mu$m, and preferably 0.1–0.3 $\mu$m. Employing such a powder, the surface property of the image forming layer is improved.

The hexahedral, tabular powder includes hexahedral ferrites such as barium ferrite and strontium ferrite, and a part of an iron elemental may be substituted with other atoms such as Ti, Co, Zn, In, Mn, Ge and Hb. These ferrite magnetic powder includes those disclosed in IEEE trans. on MAG., p.18, 16 (1982). The example of barium ferrite powder is powder, in which a part of Fe is substituted with Co and Zn, having an average particle size (average diagonal length) of 0.04 to 0.09 $\mu$m, and an aspect ratio (a ratio of diagonal length to thickness) of 2.0 to 10.0. A part of Fe of the barium ferrite powder may be substituted with a transition metal such as Ti, In, Mn, Cu, Ge and Sn.

The manufacturing method of cubic magnetic powder includes a method such as a glass crystallization method, a co-precipitation-burning method, a water heat synthetic method, a flux method, an alkoxide method or a plasma jet method. The glass crystallization method comprises the steps of (a) melting oxides or carbonates of metals necessary to form barium ferrite together with a glass forming substance such as boric acid, (b) quickly cooling the melted composition to form glass, and (c) heat treating the resulting glass at a specific temperature to form a barium ferrite crystal, followed by removing the glass component by heat treatment.

The metal containing particle content of the image forming layer is 55 to 99 weight %, and preferably 60 to 95 weight %.

The binder resin can be used without limitations, as long as the binder can carry metal containing particles and a colorant absorbing a light of a light source.

Typical binders used in the invention are polyurethanes, polyesters, and vinyl chloride type resins such as vinyl chloride copolymers. Preferably, these resins contain repeated units having at least one polar group selected from —$SO_3M$, —$OSO_3M$, —COOM and —$PO(OM_1)_2$, wherein M represents a hydrogen atom or an alkali metal atom, $M_1$ represents a hydrogen atom, an alkali metal atom or an alkyl group. These polar groups have a function to enhance dispersibility of magnetic particles and are contained in the resin at a rate ranging from 0.1 to 8.0 mol %, preferably from 0.5 to 6.0 mol %.

The binders can be used either singly or in combination of two or more kinds; when these are used in combination, the ratio of polyurethane and/or polyester to vinyl chloride type resin is within the range of usually 90:10 to 10:90, preferably 70:30 to 30:70 in weight ratio.

As the binder, a block copolymer, a graft polymer, or a modified polymer can be used. For example, a polymer modified with polyurethane or polyester has characteristics of both resins which have excellent adherence to a support and excellent colorant dispersion.

The polar group-containing polyvinyl chloride is prepared by reaction of a hydroxy group containing resin such as vinyl chloride-vinyl alcohol copolymer with a polar group and chlorine atom containing compound such as $ClCH_2CH_2SO_3M$, $ClCH_2CH_2OSO_3M$, $ClCH_2COOM$ or $ClCH_2P(=O)(OM_1)_2$. One example thereof is as follows:

The polar group conprepared by polyvinyl chloride resin is prepared by polymerization of a reactive monomer having a double bond and a polar group in the presence of a radical initiator such as benzoyl peroxide or azobisisobutylonitrile, a redox initiator or a cation polymerization initiator in an autoclave.

The monomer to incorporate a sulfonic acid or its salt includes an unsaturated hydrocarbon sulfonic acid such as vinyl sulfonic acid, allyl sulfonic acid, methacryl sulfonic acid or p-styrene sulfonic acid and its salt. In order to incorporate a carboxylic acid or its salt, for example, (meth) acrylic acid or maleic acid may be used, and in order to incorporate a phosphoric acid or its salt, for example, (meth)acryl-2-phosphate may be used.

Further, in order to improve thermal stability of a binder, an epoxy group is preferably incorporated in a vinyl chloride copolymer. The content of a unit having an epoxy group in the copolymer is 1 to 30 mol %, preferably 1 to 20 mol %. The monomer to incorporate epoxy is preferably glycidyl acrylate.

The polar group-containing polyester is prepared by condensation reaction of a polyol with a polybasic acid having a polar group. The polybasic acid having a polar group includes 5-sulfoisophthalic acid, 2-sulfoisophthalic acid, 4-sulfoisophthalic acid, 3-sulfophthalic acid, 5-sulfoisophthalic acid dialkyl, 2-sulfoisophthalic acid dialkyl, 4-sulfoisophthalic acid dialkyl and 3-sulfophthalic acid dialkyl, or a metal salt thereof, and the polyol includes trimethylolpropane, hexane triol, glycerin, trimethylolethane, neopentyl glycol, pentaerythritol, ethylene glycol, propylene glycol, 1,3-butane diol, 1,4-butane diol, 1,6-hexane diol, diethylene glycol and cyclohexane dimethanol.

The polar group-containing polyurethane is prepared by reaction of a polyol with a polyisocyanate. The polyol includes polyol polyester prepared by reaction of polyol with a polybasic acid having a polar group. The polyisocyanate includes diphenylmethane-4,4'-diisocyanate, 2,4-tolylene diisocyanate, 2,6-tolylene diisocyanate, 1,5-naphthalene diisocyanate and lydin isocyanate methylester. Another preparation method of the polar group-containing polyurethane includes a reaction of polyurethane having a hydroxy group with a compound containing a polar group and a chlorine atom such as $ClCH_2CH_2SO_3M$, $ClCH_2CH_2OSO_3M$, $ClCH_2COOM$ or $ClCH_2P(=O)(OM_1)_2$.

Besides the above resins, the binder resin includes vinyl chloride resins such as polyolefins such as butadieneacrylonitrile copolymers, polyvinyl acetals such as polyvinyl butyrals, cellulose derivatives including nitrocellulose, styrene resins such as styrene-butadiene copolymers, acryl resins such as polymethylmethacrylates, polyamide resins, phenolic resins, epoxy resins, and phenoxy resins. The addition amount of these binders is preferably not more than 20 weight % based on the total binder weight.

The binder content of the image forming layer is 1 to 50 weight %, and preferably 5 to 40 weight %.

The image forming layer may contain additives such as durability improvers, dispersing agents, anti-static agents, fillers and hardeners, as long as the effects of the invention are not inhibited.

The dispersing agents include fatty acids having 12 to 18 carbon atoms such as lauric acid and stearic acid or their amides, alkali metal salts or alkali earth metal salts, polyalkyleneoxide alkyl phosphates, lecithin, trialkyl polyolefinoxy quaternary ammonium salts and azo compounds having a carboxy group or a sulfon group. The antistatic agents include a cationic surfactant, an anionic surfactant, a nonionic surfactant, a polymeric antistatic agent and conductive fine particles and compounds described on pages 875 and 876, 11290 Chemicals, edited by Kagaku Kogyo Nippo Co. Ltd.

The fillers include inorganic fillers such as carbon black, graphite, $TiO_2$, $BaSO_4$, ZnS, $MgCO_3$, $CaCO_3$, ZnO, CaO, $WS_2$, $MoS_2$, MgO, $SnO_2$, $Al_2O_3$, $\alpha\text{-}Fe_2O_3$, $\alpha\text{-}FeOOH$, SiC, $CeO_2$, BN, SiN, MoC, BC, WC, titanium carbide, corundum, artificial diamond, garnet, tripoli, diatomaceous earth, dolomite, and organic fillers such as polyethylene resin particles, fluorine-containing resin particles, guanamine resin particles, acryl resin particles, silicone resin particles, and melamine resin particles. These fillers can be used as a releasing agent. The addition amount of the inorganic or organic fillers is preferably 0.1 to 50 weight %, although the amount varies depending on their specific gravity.

The hardeners are used without any limitations as long as they can harden the image forming layer, and include, for example, polyisocyanates which are used in preparing polyurethanes for the binder described above.

The hardeners harden the image forming layer and give the image having high durability, and stainings at abraded portions can be reduced. Since the hardened layer has solvent resistance, an image protective layer can be coated on the image forming layer without any damage thereof employing a coating solution using an organic solvent. As a result, this can provide an image forming material having more excellent durability than that employing an image protective layer comprised of a water soluble or water dispersed resin.

The addition amount of the additives in the image forming layer is not more than 20 weight %, and preferably not more than 15 weight %.

The thickness of the image forming layer is 0.05 to 5.0 $\mu$m, and preferably 0.1 to 3.0 $\mu$m. The image forming layer may be a single layer or multiple layers whose compositions may be the same or different. In the multiple layers, the layer closest to a support preferably contains a colorant capable of absorbing light of a light source in a larger amount. The layer farther from a support may contain a colorant capable of absorbing a light having a wavelength longer than the light of a light source.

The image forming layer is formed by kneading a colorant, a binder, and optionally durability improving agents, dispersants, anti-static agents, fillers and hardeners in solvents to obtain a coating solution, coating the coating solution on the support and drying.

The solvents include alcohols (ethanol, propanol), cellosolves (methyl cellosolve, ethyl cellosolve), aromatic solvents (toluene, xylene, chlorobenzene), ketones (acetone, methylethyl ketone), esters (ethylacetate, butylacetate), ethers (tetrahydrofurane, dioxane), halogenated solvents (chloroform, dichlorobenzene), amide type solvents (dimethylformamide, N-methylpyrrolidone).

The kneaders for an image forming layer composition Suitable examples include two-roll mills, three-roll mills, ball mills, pebble mills, coball mills, Tron mills, sand mills, sand grinders, Sqegvari attritor, high-speed impeller dispersers, high-speed stone mills, high-speed impact mills, dispersers, high-speed mixers, homogenizers, supersonic dispersers, open kneaders, and continuous kneaders.

In order to coat an image forming layer on a support, coating is carried out by an extrusion method. Magnetic particles are optionally oriented or calender treatment may be carried out in order to make uniform the surface of the image forming layer. The magnetic particles are preferably oriented in order to give high resolving power, since the cohesion of the layer can be easily controlled.

When the image protective layer is provided on the image forming layer, each layer may be coated separately, and the layers may be multilayer coated by wet-on wet coating method.

In carrying out wet-on-wet multilayer coating, a combination of an extrusion coater with a reverse roll, a gravure roll, an air doctor coater, a blade coater, an air knife coater, a squeeze coater, a dip coater, a bar coater, a transfer roll coater, a kiss coater, a cast coater or a spray coater can be used.

The adhesion between upper and lower layers is enhanced, since in the multilayer coating according to the wet-on-wet method the upper layer is coated on the wet lower layer.

The calender treatment referred to in the invention means a process in which, after the image forming layer is provided on the support, the resulting material is passed between a nip roller with 1 to 100 cm diameter having a smooth surface and a heat roller capable of being heated at a specific temperature and pressure, whereby voids in the image forming layer, which occur in the coating and drying steps, are reduced to obtain a high density image forming layer.

The line pressure of the nip roller is ordinarily 2 to 100 kg/cm, preferably 5 to 50 kg/cm in order to reduce voids of the image forming layer. The temperature applied is ordinarily 40° to 200° C., preferably 50° to 120° C., but since the temperature varies due to a transporting speed, the optimal temperature is set to give a maximum temperature elevating speed of 30° to 100° C. in the image forming layer during calender treatment. The calender treatment is preferably carried out after coating of the image forming layer.

Figure 1B:
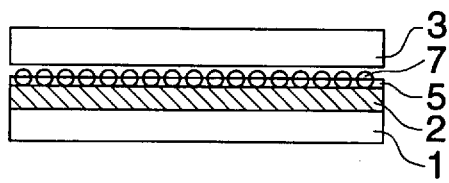
Figure 1C:
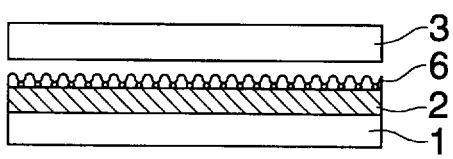
Figure 1A:
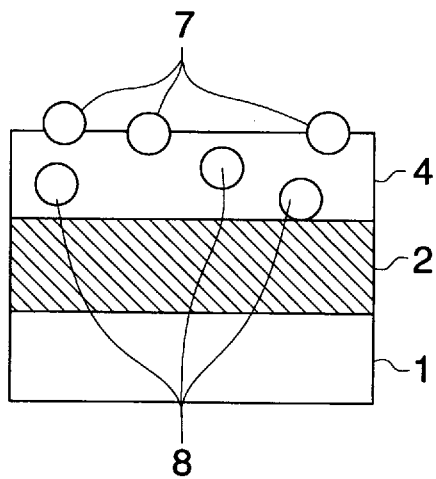
Figure 1B:
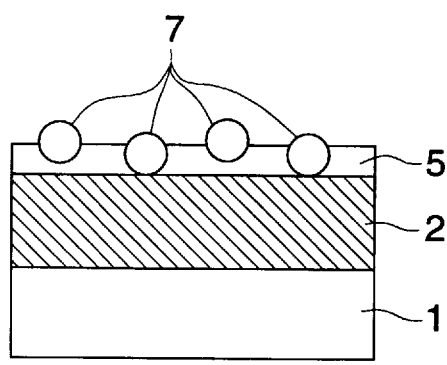

FIG. 1(A) is one preferable embodiment of the image forming material of the invention which comprises an image forming layer 2 and an image protective layer 4 containing fine particles provided on a support 1 in that order and an image receiving layer 3 adjacent to the image protective layer 4. FIG. 1(B) is another preferable embodiment of the image forming material of the invention which comprises an image forming layer 2 and an image protective layer 5 containing fine particles provided on a support 1 in that order, some particles 7 having a diameter greater than the thickness of the image protective layer 5. FIG. 1(A') magnifies FIG. (A). In the image protective layer 4 of FIG. 1(A'), some particles (Number 7) protrude from the surface and other particles (Number 8) are buried in the layer. FIG. 1(B') magnifies FIG. (B). In the image protective layer 5 of FIG. 1(B'), all particles (Number 7) protrude from the surface, since the particle diameter r is greater than the thickness d of the image protective layer 5. FIG. 1(C) is still another preferable embodiment of the image forming material of the invention which comprises an image forming layer 2 and an image protective layer 6 provided on a support 1 in that order, the surface of the image protective layer being roughened, and an image receiving layer 3 adjacent to the image protective layer.

<Image protective layer>>

The thickness of the image protective layer in the invention is 0.03 to 1.0 μm, and preferably 0.05 to 0.5 μm.

In the invention, the surface of the image protective layer on the image receiving material side has a smoothter value of 1 to 200 mmHg, preferably 1 to 100 mmHg, at 23° C. and 55% RH. The smoothter value can be adjusted by roughening the surface of the image protective layer with a sand blast method or by incorporating fine particles in the image protective layer. The smoothter value is obtained by measuring the surface using a smoothter SM-6B produced by Toei Denkikogyo Co., Ltd.

One embodiment of the image protective layer in the invention is comprised essentially of a binder and fine particles.

The resin for the binder can be used without any limitation, as long as it can carry the fine particles. The binder resin includes polyurethane, polyester, vinyl chloride resins such as vinyl chloride copolymers and vinyl chloride-vinyl acetate copolymers, polyolefins such as butadiene-acrylonitrile copolymers, polyvinyl acetals such as polyvinyl butyrals, cellulose derivatives including nitrocellulose, styrene resins such as styrene-butadiene copolymers, acryl resins such as polymethyl methacrylates, polyamide resins, phenolic resins, epoxy resins, phenoxy resins, and water soluble resins such as polyvinyl alcohol and gelatin. The resin binders can be used singly or in combination.

The resin has a glass transition temperature of preferably 80° to 200° C. Such a resin includes polyester resins such as Eliter UE3690 produced by Unichika Co., Ltd. and acryl resins such as Dianar BR-50, BR-52, BR-73, BR-75, BR-77, BR-80, BR-82, BR-83, BR-85, BR-87, BR-88, BR-95, BR-100, BR-108 produced by Mitsubishi Rayon Co., Ltd., polyurethane such as Bilon-1400 produced by Toyo Boseki Co., Ltd., phenoxy resins such as PKHC, PKHH and PKHJ produced by Union Carbide Co., Ltd. and Phenototo YP-50, YP-50S produced by Toto Kasei Co., Ltd., and polyvinyl acetal resins such as Eslec KS-1, KS-5, BX-1, BX-2, BX-5 and BX-55 produced by Sekisui Kagaku Kogyo Co., Ltd. The resin with a transition temperature lower than 80° C. may result in the low resolving power and the resin with a transition temperature over 200° C. results in lowering of its solubility to a solvent.

The image protective layer in the invention is preferably hardened with a hardener.

The binder resin of the image protective layer preferably has a functional group capable of being hardened with a hardener. For example, when the image protective layer contains an isocyanate compound as a hardener, the resin has preferably a hydroxy group, and when the image protective layer contains an amine compound as a cross-linking agent, the resin has preferably an epoxy.

The content of the binder resin in the image protective layer is 10 to 99.5% by weight, and preferably 40 to 98% by weight.

The image protective layer preferably contains a hardener such as a polyisocyanate in order to enhance its durability.

When the image protective layer is hardened, the binder resin of the image protective layer has a functional group capable of reacting with a hardener and cross-linking. For example, when the hardener is an isocyanate compound, a phenoxy, cellulose, polyvinyl acetal, acryl or urethane resin, a polyvinyl chloride resin or a polyester resin is preferably used.

In the invention, when the image protective layer is coated on the image forming layer, at least one of solvents used in the image forming layer coating solution is preferably the same as one of solvents used in the image protective layer coating solution in view of durability of the image forming material. The solvents include alcohols (ethanol, propanol), cellosolves (methyl cellosolve, ethyl cellosolve), aromatic solvents (toluene, xylene, chlorobenzene), ketones (acetone, methylethyl ketone), esters (ethylacetate, butylacetate), ethers (tetrahydrofurane, dioxane), halogenated solvents (chloroform, dichlorobenzene), and amide type solvents (dimethylformamide, N-methylpyrrolidone).

When the image protective layer is provided on the image forming layer hardened by hardening the binder with a hardener, the resulting material is preferable in view of improved resolving power and anti-scratching property.

The fine particles include inorganic fillers such as carbon black, graphite, $TiO_2$, $SiO_2$, $BaSO_4$, ZnS, $MgCO_3$, $CaCO_3$, ZnO, CaO, $WS_2$, $MoS_2$, MgO, $SnO_2$, $Al_2O_3$, $\alpha$-$Fe_2O_3$, $\alpha$-FeOOH, SiC, $CeO_2$, BN, SiN, MoC, BC, WC, titanium carbide, corundum, artificial diamond, garnet, tripoli, diatomaceous earth, dolomite, and organic fillers such as polyethylene resin particles, fluorine-containing resin particles, guanamine resin particles, acryl resin particles, silicone resin particles, and melamine resin particles. These fillers can be used as a releasing agent.

The invention is effected by an image protective layer in which some fine particles protrude from the surface. Accordingly, an average particle size r of the fine particles greater than the thickness r of the image protective layer is advantageous, since most particles protrude from the surface of the image protective layer.

However, when the fine particles are too large, the image protective layer cannot sufficiently carry the particles or results in poor anti-abrasion.

Therefore, the average particle size r of the fine particles in the invention is preferably 0.3 to 20 $\mu$m, and more preferably 0.3 to 4.5 $\mu$m.

The fine particles may be used singly or in combination of two or more kinds. When two or more kinds of fine particles are used, the average particle size is an average particle size of all particles.

The content of the fine particles in the image protective layer in the invention is 2 to 150 mg/m$^2$, and preferably 2 to 100 mg/m$^2$.

In the invention, when the fine particles have a polymerizable functional group on the surface, image durability is greatly improved since adhesion between the image forming layer and the fine particles is enhanced during hardening. The example of the fine particles includes FX-GSZ-07 produced by NIPPON SHOKUBAI Co., Ltd.

Another embodiment of the image protective layer in the invention is an image protective layer containing essentially a binder and optionally additives such as fine particles in which the surface of the image protective layer contacting the image receiving material has a smoohter value of 1 to 200 mmHg, preferably 1 to 100 mmHg, at 23° C. and 55% RH.

In this embodiment, the resin used and additives optionally used such as fine particles are the same as those described above.

<Image receiving material>

The image receiving material in the invention is a material capable of receiving an image forming layer at exposed portions in which adhesive force between the image forming layer and the support is reduced by exposing an image forming material having the image receiving material to high density energy light wherein the exposed portions of the image forming layer are transferred to the image receiving material on separating the image receiving material from the image forming layer. The image receiving material in the invention is one containing essentially a binder and optionally additives such as fine particles.

In the image forming method described later, the image receiving material provided to receive an image after exposure and separation may be the resin film above described as used for a support for the image forming material or the resin film having thereon an image receiving layer, which is capable of receiving a high density energy light exposed image forming layer.

The substrate of a support for an image receiving material includes paper, synthetic paper (such as synthetic paper consisting mainly of polypropylene) and those as denoted in the support of the image forming material.

The thickness of the substrate is usually 10 to 500 $\mu$m, and preferably 20 to 200 $\mu$m.

As a receiving layer provided on the substrate are employed resins as described later such as a polyester resin, a urethane resin, a vinyl chloride resin and an acryl resin, which are used for a conventional adhesive.

The embodiment of the image receiving material is a polyolefin film, a polyolefin resin layer formed on the surface of an image receiving material by an extrusion coating method or a polyolefin resin layer formed on the surface of an image receiving material by coating a polyolefin solution and drying. The polyolefin of the polyolefin resin layer is a resin containing an olefin unit as a main component, for example, a resin containing an olefin unit in an amount of 50 weight % and another monomer unit such as styrene or vinyl acetate.

A method for providing the image receiving material on the image forming layer includes a method of coating a solution or dispersion containing the above described components on the image forming layer using a blade coater, a roller coater, a bar coater, a curtain coater or a gravure coater, an extrusion coating method according to hot melting or a laminating method according to a cushion layer film.

When the image receiving material is provided on the image protective layer and the image receiving material is a self-supporting resin, the material is provided on the image protective layer by dissolving the resin in a solvent to obtain a coating solution and coating the solution on the image protective layer. When the resin film used for a support is used as an image receiving material and the film is a heat sealable polyolefin, the film is provided and laminated on the image protective layer by applying heat and pressure using a hot stamp or heat roller to obtain an image forming material. When the film does not have a heat sealability, a receiving layer is provided the film and subjected to pressure treatment or heat pressure treatment to obtain an image forming material.

The heat treatment by a heat roller is carried out at room temperature to about 180° C., preferably 30° to 160° C., at a pressure of 0.1 to about 20 kg/cm, preferably 0.5 to 10 kg/cm and at a transporting speed of 1 to 200 mm/second, preferably 5 to 100 mm/second. The heat treatment by a hot stamp is carried out at room temperature to about 180° C., preferably 30° to 150° C., at a pressure of 0.05 to 10 kg/cm$^2$, preferably 0.5 to 5 kg/cm$^2$ for 0.1 to about 50 seconds, preferably 0.5 to 20 second.

In the invention, the image forming material having a peeling force of 1 to 50 gf/cm, preferably 1–25 gf/cm according to a 180° peeling method of JIS C 2107 (JIS Z 0237) between the image receiving material and image protective layer gives an image high resolving power and reduced remaining density at exposed portions after peeling the image receiving material.

The peeling force can be controlled by adjusting pressure or temperature applied in the laminating the image receiving material on the image forming layer or image protective layer. The peeling force may be set by coating a self-supporting resin on an image protective layer or by extrusion coating a hot-melted resin on an image protective layer to form an image receiving material. Further, peeling force may be set by providing a receiving layer on a resin film used as the substrate as above described and then adhering the receiving layer to an image protective layer to form an image receiving material. Adhering may be carried out before or after exposure.

The receiving layer herein referred to may be a layer itself having adhesion property, or a layer producing adhesion property by applied heat or pressure which can be formed using, for example, a low softening point resin, an adhesive or a heat solvent.

The low softening point resin includes an ethylene copolymer such as ethylene-vinylacetate copolymer or ethylene-ethylacrylate copolymer, a polystyrene resin such as styrene-butadiene copolymer, styrene-isoprene copolymer, or styrene-ethylene-butylene copolymer, a polyester resin, a polyurethane resin, a polyolefin resin such as polyethylene or polypropylene, a polyvinyl ether resin, a polyacrylate resin such as polybutylmethacrylate, an ionomer resin, a cellulose, an epoxy resin, a polyvinyl chloride resin such as copolyvinylchloride-vinylacetate, polyvinyl alcohol and a polyvinyl alcohol derivative such as polyvinyl butyral. The adhesive includes modified or non-modified rosins such as rosin, hydrogenated rosin, rosin-maleic acid, polymeric rosin and rosin phenol, and terpenes and petroleum resins or their modified resins. The heat solvent includes compounds which are solid at ordinary temperature and thermally reversibly liquefies or softens, concretely, monomolecular compounds such as terpineol, menthol, acetoamide, benzamide, cumarine, benzyl cinnamate, diphenylether, crown ether, camphor, p-methylacetophenone, vanillin, dimethoxybenzaldehyde, p-benzyldiphenyl, stilbene, margaric acid, eicosanol, cetylpalmitate, stearic amide, and behenylamine, waxes such as bees wax, candelilla wax, paraffin wax, ester wax, montan wax, carnauba wax, amide wax, polyethylene wax and microcrystalline wax, rosin derivatives such as ester gum, rosin-maleic acid resins and rosin phenol resins, a phenol resin, a ketone resin, an epoxy resin, a diallylphthalate resin, a terpene type hydrocarbon resin, a cyclopentadiene resin, a polyolefin resin, a polycaprolactam resin, and polyethylene oxides such as polyethylene glycol and polypropylene glycol.

The thickness of the receiving layer is usually 0.1 to 40 $\mu$m, and preferably 0.3 to 30 $\mu$m. The thickness of the image receiving material including a support is 10 to 200 $\mu$m, and preferably 20 to 100 $\mu$m.

The receiving layer is formed by kneading the above described receiving layer composition with a solvent to obtain a coating solution, and then coating the coating solution on the support and drying.

The solvent, in which the receiving layer composition is dissolved or dispersed to prepare a coating solution for the adhesive layer, includes alcohols (ethanol, propanol), cellosolves (methyl cellosolve, ethyl cellosolve), aromatic solvents (toluene, xylene, chlorobenzene), ketones (acetone, methylethyl ketone), esters (ethylacetate, butylacetate), ethers (tetrahydrofurane, dioxane), halogenated solvents (chloroform, dichlorobenzene), amide type solvents (dimethylformamide, N-methylpyrrolidone) and dimethylsulfoxide. The adhesive layer is provided on a support by an extrusion coating method which includes hot-melting the adhesive composition and then extruding.

<Image forming method>

The image forming method in the invention comprises the steps of imagewise exposing to a high density energy light an image forming material comprising an image forming layer on a support, whereby adhesion force at the exposed portions between the support and the image forming layer is reduced, and then removing the image forming layer at exposed portions.

In the invention an image can be obtained by the following two image forming methods using the above described image forming material, and the methods will be explained below.

Image forming method 1

The image forming method 1 comprises the steps of (a) imagewise exposing to a high density energy light an image forming material comprising an image forming layer on a support, whereby adhesion force at the exposed portions (hereiafter referred to as abraded portions) between the support and the image forming layer is reduced, and then removing the image forming layer only at exposed portions together with an image protective layer using an image forming layer removing method.

The typical removing method includes a method employing an adhesive sheet, a method sucking the abraded portions, a method scraping with a blush or a method blowing with an air blush.

In order to obtain a high resolving power, the light source is preferably an electromagnetic wave capable of making the energy spots smaller, particularly, a UV light having 1 nm to 1 mm wavelength, a visible light or an infrared light. Such a high density energy light includes, for example, a laser light, an emission diode, a xenon flush lamp, a halogen lamp, a carbon arc light, a metal halide lamp, a tungsten lamp, a quarts mercury lamp and a high pressure mercury lamp. The energy applied is optionally adjusted by selecting an exposure distance, an exposure time or an exposure strength according to kinds of image forming materials used.

When an entire exposure is carried out using the high density energy light, the exposure is carried out through a mask material having a negative pattern made of a light shielding material.

When an array light such as an emission diode array is used or exposure using a halogen lamp, a metal halide lamp or a tungsten lamp is controlled using an optical shutter material such as liquid crystal or PLZT, a digital exposure according to an image signal is possible, and direct writing is possible without using the mask material.

However, this method requires additional optical shutter beside the light source. Therefore, the digital exposure is preferably carried out using a laser light.

When the laser light is used, the light can be condensed in the beam form and a latent image is formed using a scanning exposure according to an image. The laser light is easy to condense the exposure spots in small size and therefore, a highly dissolved image can be obtained.

The laser light used in the invention is well known. The laser source includes solid lasers such as a ruby laser, a YAG laser, a glass laser, a gas laser such as a He-Ne laser, a Ar laser, a Kr laser, a $Co_2$ laser, a Co laser, a He-Cd laser, a $N_2$ laser, an eximer laser, an semiconductor laser such as a InGaP laser, a AlGaAs laser, a GaAsP laser, a InGaAs laser, a InAsP laser, $CdSnP_2$ laser or a GaSb laser, a chemical laser, and a dye laser. Of these laser light sources, a laser having a 600 to 1200 nm wavelength is preferable in sensitivity in order to produce effectively abrasion, since a light energy can be effectively converted to a heat energy.

The high density light exposure is preferably carried out from the support side.

Image forming method 2

The image forming method 2 comprises the steps of exposing an image forming material having an image forming layer, an image protective layer and an image receiving material on a support in that order to high density energy light whereby adhesive force between the image forming layer and the support is reduced and separating the image receiving material from the image protective layer to transfer the exposed portions of the image forming layer to the image receiving material. In the invention, the image forming material has a peeling force of preferably 1 to 50 gf/cm, more preferably 1–25 gf/cm according to a 180° peeling method of JIS C 2107 (JIS Z 0237) between the image receiving material and image protective layer.

The imagewise exposure is preferably carried out from the support side in this image forming method. The imagewise exposure is preferably carried out to reduce or lose only the adhesion force between the support and the image forming layer without destroying the image forming layer, since the exposed portions of the image forming layer can be uniformly transferred to the image receiving material without release of dust in the exposure.

Figure 2:
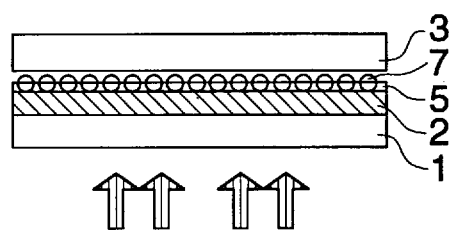
FIGS. 2a), 2b) and 2c) show one of the image forming process in the invention.
Figure 2:
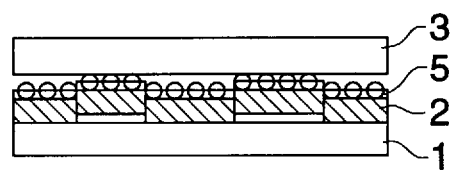
Figure 2:
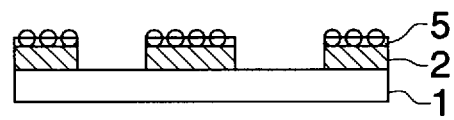

FIGS. 2(a), 2(b) and 2(c) illustrate an example of the above described image forming methods using the image forming material of FIG. 1B. The method comprises the steps of imagewise exposing (a) to a high density energy light an image forming material, in having an image forming layer 2, an image protective layer 5 and an image receiving material 3 on a support 1 in that order, from the support side, whereby adhesion force at the exposed portions between the support 1 and the image forming layer 2 is reduced (b) without changing adhesion force between the image forming layer 2 and the image receiving material 3, and peeling (c) the image receiving material from the image protective layer whereby the exposed portions are transferred to the image receiving material side to form an image.

The thickness of the image receiving material in the above two image forming methods is preferably 10 to 200 μm, and more preferably 20 to 100 μm.

Various peeling methods of the image receiving material can be employed as long as they have no adverse affect on image forming. The peeling methods include a method of peeling the image receiving material with a fixed peeling angle using a peeling plate or a peeling roller and a method of manually peeling the image receiving material without fixing the image forming material.

The image forming material having an image forming layer provided directly on a support was described above. However, when an intermediate layer is provided between an image forming layer and a support, abrasion may be caused between the support and the intermediate layer or between the image forming layer and the intermediate layer, or a part of the intermediate layer may be heat destroyed.

EXAMPLES

The invention is hereunder described with examples, but the scope of the invention is by no means limited to them. In the examples, all "parts" are parts by weight, unless otherwise specified.

Example 1

<Image forming material>

The inventive image forming material and comparative image forming material (sample Nos. 1 through 12) were prepared using a support, an image forming layer, an image protective layer, and an image receiving material as shown below.

-Support-

One hundred Mm thick transparent polyethylene terephthalate film subjected to corona discharge on the image forming layer side surface (T-100: produced by Diafoil Hoechst Co., Ltd.)

-Image forming layer-

Image forming layer-1

The following composition was kneaded and dispersed with an open kneader to obtain an image forming layer coating solution containing magnetic particles. The resulting coating solution was coated on the support, subjected to magnetic orientation before drying, dried, subjected to calender treatment under the following conditions, and heated at 60° C. for 72 hours for hardening to give an image forming layer having a dry thickness of 1.2 μm.

(Calender treatment)

The heat and pressure treatment was carried out by passing the image forming layer coated material between a carender roller, in which a 3 mm polyimide resin is wound around a 300 mm metal roller, and a 300 mm heat metal roller heated to 80° C. at a line pressure of 10 kg/cm at a speed of 10 m/minute.

(Image forming layer coating solution composition)

Fe—Al ferromagnetic metal powder, 100 parts Colorant P-1 (as colorant or metal containing powder, Fe:Al ratio in number of atoms:overall average=100:4, surface layer= 50:50, average major axial length=0.14 μm)

| | |
|---|---|
| Potassiumsulfonate-containing vinyl chloride resin (MR110 made by Nippon Zeon Co., Ltd.) | 10 parts |
| Sodiumsulfonate-containing polyurethane resin (UR8700 made by Toyobo Co., Ltd.) | 10 parts |
| α-Alumina (average particle size: 0.15 μm) | 8 parts |
| Stearic acid | 1 part |
| Polyisocyanate (Coronate L made by Nihon Polyurethane Kogyo Co., Ltd.) | 5 parts |
| Cyclohexanone | 100 parts |
| Methyl ethyl ketone | 100 parts |
| Toluene | 100 parts |

-Image protective layer-

The following composition containing a resin and fine particles was provided on the above obtained image forming layer by a wire bar coating method. Thus, a protective layer as shown in Table 1 was formed.

| | |
|---|---|
| Binder resin (UCAR phenoxy resin PKHH made by Union Carbide Co., Ltd.) | 3.5 parts |
| Hardener diphenylmethane-4,4'-diisocyanate (Milionate MT made by Nihon Polyurethane Kogyo Co., Ltd.) | 1.5 parts |
| Silicone resin fine particles (Average particle size: 2.0 μm) (Tospar 120 produced by Toshiba Silicone Co., Ltd.) | Content shown in Table 1 |
| Methyl ethyl ketone | 45 parts |
| Toluene | 50 parts |

-Image receiving material-

The following compsition was provided on a 38 μm thick white polyethylene terephthalate film (W-400, made by Diafoil Hoechst Co., Ltd.) to obtain an image receiving layer having a dry thickness of 1.1 g/m².

| | |
|---|---|
| Polyurethane resin (Solid content: 20.9%) (Nipporane 3116, made by Nihon Polyurethane Kogyo Co., Ltd.) | 30 parts |
| Methyl ethyl ketone | 35 parts |
| Toluene | 35 parts |

The image receiving material was adhered to the image protective layer so that the image receiving layer contacted the image protective layer using pressure rollers (transporting speed: 30 mm/second, Pressure: 3.0 kg/cm). Thus, image forming material sample Nos. 1 through 12 were obtained.

<Image forming method>

The image forming material was imagewise scanning exposed from the support side, focussed on the surface of the image forming layer using a simiconductor laser (LT090MD, main wavelength: 830 nm, produced by Sharp Co., Ltd.), whereby adhesion force between the image forming layer and the support was reduced at exposed portions, and the image forming layer was separated from the image receiving material to form an image.

The thickness d of the image forming layer, the fine particle content, the fine particle average diameter r, the relation between d and r, exposure amount, density at exposed portions (stain), resolving power of the image formed, solvent resistance and anti-abrasion were evaluated according to the following criteria.

-Exposure amount-

The average exposure amount (E1, mJ/cm$^2$) on the image forming material surface was measured which is necessary to form a solid image of 0.5 mm×0.5 mm by scanning-exposing with a light having a 4 $\mu$m beam diameter, and sensitivity was evaluated according to the following four stages.

A: E$\leqq$250

B: 250<E$\leqq$400

C: 400<E$\leqq$800

D: 600<E

-Stain-

Visible light optical density at exposed portions of the image forming material was measured using a densitometer (X-rite 310Tr produced by X-rite Co., Ltd.). The optical density of the support was subtracted.

A: OD not more than 0.03 (excellent)

B: OD of 0.04 to 0.05 (no practical problem)

C: OD of 0.06 to 0.09 (unevenness was observed by a magnifier)

D: OD not less than 0.1 (unevenness was visually observed)

-Resolving power-

The imagewise scanning exposure was carried out to form an image at an average exposure amount at a scanning pitch of 12 $\mu$m with a light having a 6 $\mu$m beam diameter, and resolving power of the image formed was evaluated in terms of lines N per 1 mm, which are resolved, according to the following four stages.

A: 80$\leqq$N

B: 40$\leqq$N<80

C: 20$\leqq$N<40

D: N<20

-Solvent resistance-

The image protective layer (before laminating of the image receiving material) was rubbed in 10 cm back-and-forth strokes with an applicator (produced by Johnson & Johnson Co., Ltd.) with toluene impregnated at a 100 g applied load, so that the applicator contacted perpendicularly the layer. Thereafter, the resulting surface was evaluated according to the following criteria:

A: No change

B: Glossiness was changed, but the image forming layer was not damaged. The applicator also did not discolor.

C: A part of the image forming layer was dissolved, and the applicator discolored.

D: The image forming layer was completely dissolved.

-Anti-abrasion-

The image protective layer (before laminating of the image receiving material) was tested using a scratch meter in which a load of 150 g was applied onto a 0.1 mm diameter needle. Thereafter, the resulting surface was evaluated according to the following criteria:

A: No change

B: Glossiness was changed, but no smut observed on the image forming layer.

C: A part of the image forming layer was damaged resulting in lowering of the optical density of the damaged part, and/or smut was observed on the image forming layer surface.

D: Scratching penetrated at the support surface.

TABLE 1

| Sample No. | Thickness d ($\mu$m) | Fine particle content mg/m$^2$ | Average particle size r ($\mu$m) | r $\geqq$ d | Exposure amount | Stain | Resolving power | Solvent resistance | Anti-abrasion |
|---|---|---|---|---|---|---|---|---|---|
| 1 | 0.00 | 0 | 0.0 | D | D | D | D | D | D |
| 2 | 0.02 | 15 | 2.0 | B | A | C | C | D | D |
| 3 | 0.03 | 15 | 2.0 | B | A | B | B | C | B |
| 4 | 0.05 | 15 | 2.0 | B | A | A | A | B | B |
| 5 | 0.1 | 15 | 2.0 | B | A | A | A | A | A |
| 6 | 0.2 | 15 | 2.0 | B | A | A | A | A | A |
| 7 | 0.3 | 15 | 2.0 | B | A | A | A | A | A |
| 8 | 0.5 | 15 | 2.0 | B | A | A | A | A | A |
| 9 | 0.8 | 15 | 2.0 | B | B | B | B | A | A |
| 10 | 1.0 | 15 | 2.0 | B | B | B | B | A | A |
| 11 | 1.5 | 15 | 2.0 | B | D | C | D | A | A |
| 12 | 2.0 | 15 | 2.0 | B | D | D | D | A | A |

Example 2

Sample Nos. 13 through 29 were prepared in the same manner as in Example 1, except that the image protective layer thickness and fine particle content were varied as shown in Table 2, and evaluated in the same manner as in Example 1.

TABLE 2

| Sample No. | Thickness d (μm) | Fine particle content mg/m² | Average particle size r (μm) | r ≧ d | Exposure amount | Stain | Resolving power | Solvent resistance | Anti- abrasion |
|---|---|---|---|---|---|---|---|---|---|
| 13 | 0.15 | 0 | — | D | D | D | D | D | D |
| 14 | 0.15 | 1 | 2.0 | B | D | D | D | A | D |
| 15 | 0.15 | 2 | 2.0 | B | B | B | B | A | B |
| 16 | 0.15 | 5 | 2.0 | B | B | B | B | A | A |
| 17 | 0.15 | 10 | 2.0 | B | A | A | A | A | A |
| 18 | 0.15 | 20 | 2.0 | B | A | A | A | A | A |
| 19 | 0.15 | 40 | 2.0 | B | A | A | A | A | A |
| 20 | 0.15 | 60 | 2.0 | B | A | A | A | A | A |
| 21 | 0.15 | 80 | 2.0 | B | A | A | A | A | A |
| 22 | 0.15 | 100 | 2.0 | B | A | A | A | A | A |
| 23 | 0.15 | 150 | 2.0 | B | A | B | B | B | B |
| 24 | 0.15 | 200 | 2.0 | B | B | C | C | D | D |
| 25 | 0.15 | 250 | 2.0 | B | B | D | D | D | D |
| 26 | 0.02 | 4 | 2.0 | B | D | D | D | D | C |
| 27 | 0.02 | 160 | 2.0 | B | B | C | C | D | D |
| 28 | 1.10 | 4 | 2.0 | B | D | D | D | B | B |
| 29 | 1.10 | 160 | 2.0 | B | C | C | C | D | D |

Example 3

Sample Nos. 30 through 43 were prepared in the same manner as in Example 1, except that fine particles were varied as follows, and the image protective layer thickness and fine particle content were varied as shown in Table 3, and evaluated in the same manner as in Example 1.
(Fine particles used)
Sample Nos. 30 to 32 and sample No. 36
Organic silicone resin Tospar 103 produced by Toshiba Silicone Co., Ltd.
Sample No. 33
Silica sol Organo silica sol CX-SZ produced by Nihon Shokubai Co., Ltd.
Sample No. 34
α-Alumina pure Alumina AKP-50 produced by Sumitomo Kagaku Co., Ltd.
Sample No. 35
Calcium carbonate MC-S5 produced by Maruo Calcium Co., Ltd.
Sample No. 37
Organic silicone resin Tospar 108 produced by Toshiba Silicone Co., Ltd.
Sample No. 38
Polymethylmethacrylate MX-150 produced by Soken Kagaku Co., Ltd.
Sample No. 39
Organic silicone resin Tospar 120 produced by Toshiba Silicone Co., Ltd.
Sample No. 40
Organic silicone resin Tospar 145 produced by Toshiba Silicone Co., Ltd.
Sample No. 41
Organic silicone resin Tospar 3120 produced by Toshiba Silicone Co., Ltd.
Sample No. 42
Polymethylmethacrylate MR-20G produced by Soken Kagaku Co., Ltd.
Sample No. 43
Polystyrene SGP-100C produced by Soken Kagaku Co., Ltd.

TABLE 3

| Sample No. | Thickness d (μm) | Fine particle content mg/m² | Average particle size r (μm) | r ≧ d | Exposure amount | Stain | Resolving power | Solvent resistance | Anti- abrasion |
|---|---|---|---|---|---|---|---|---|---|
| 30 | 0.1 | 25 | 0.3 | B | A | A | A | A | A |
| 30 | 0.1 | 25 | 0.3 | B | A | A | A | A | A |
| 31 | 0.2 | 25 | 0.3 | B | A | A | A | A | A |
| 32 | 0.3 | 25 | 0.3 | B | A | A | B | B | A |
| 33 | 0.02 | 25 | 0.03 | D | C | D | B | B | C |
| 34 | 0.02 | 25 | 0.2 | D | C | D | B | B | C |
| 35 | 0.02 | 35 | 0.1 | D | C | D | B | B | B |
| 36 | 0.2 | 35 | 0.3 | B | B | B | B | B | B |
| 37 | 0.2 | 35 | 0.8 | B | A | B | A | A | B |
| 38 | 0.2 | 35 | 1.5 | B | A | A | A | A | A |
| 39 | 0.2 | 35 | 2.0 | B | A | A | A | A | A |
| 40 | 0.2 | 35 | 4.5 | B | A | A | A | A | B |
| 41 | 0.2 | 35 | 12 | B | B | A | B | B | C |
| 42 | 0.2 | 35 | 20 | B | B | A | B | B | C |
| 43 | 0.2 | 35 | 25 | B | B | B | C | B | C |

Example 4

Sample Nos. 44 through 49 were prepared in the same manner as in Example 1, except that the fine particles of the image protective layer were varied as shown in Table 4 to give the smoothter value as shown in Table 4 of the surface of the image protective layer after separation. Sample Nos. 50 through 58 were prepared in the same manner as in Example 1, except that the following image protective layer coating aolution was provided to give a dry thickness of 0.4 µm and then subjected to sand blast treatment to roughen its surface and give the smoothter value of the surface as shown in Table 4. The resulting samples were evaluated in the same manner as in Example 1. The results are shown in Table 4.

-Image protective layer-

| | |
|---|---|
| Phenoxy resin UCAR phenoxy resin PKHH produced by Union Carbide Co., Ltd. | 7 parts |
| Hardener tolylenediisocyanate Colonate L (Solid content 75 weight %, produced by Nihon Polyurethane Kogyo Co., Ltd.) | 4 parts |
| Cyclohexanone | 29 parts |
| Methylethyl ketone | 80 parts |
| Toluene | 80 parts |

-Image forming layer of Sample Nos. 60 and 61-

The following composition was kneaded with an open kneader to obtain an image forming layer coating solution containing magnetic powder. The resulting coating solution was coated on a support, subjected to magnetic orientation before drying, dried, subjected to calender treatment and heated for hardening at 50° C. for 72 hours to give an image forming layer having a dry thickness of 1.0 µm.

| | |
|---|---|
| Potassiumsulfonate-containing vinyl chloride resin (MR110 made by Nippon Zeon Co., Ltd.) | 10 parts |
| Sodiumsulfonate-containing polyurethane resin (UR8700 made by Toyoboseki Co., Ltd.) | 10 parts |
| α-Alumina (average particle size: 0.15 µm) | 8 parts |
| Carbon black (average particle size: 0.04 µm) | 0.5 parts |
| Colorant P-2 | |
| Stearic acid | 1 part |
| Butyl stearate | 1 part |
| Polyisocyanate (Hardener, Colonate L made by Nihon Polyurethane Kogyo Co., Ltd.) | 5 parts |
| Cyclohexanone | 100 parts |
| Methyl ethyl ketone | 100 parts |
| Toluene | 100 parts |

TABLE 4

| Sample No. | Thickness d (µm) | Fine particle content mg/m² | Smoothter value mmHg | Fine particles | Exposure amount | Stain O.D. | Resolving powder | Solvent resistance | Anti-abrasion |
|---|---|---|---|---|---|---|---|---|---|
| 44 | 0.3 | 20 | 5 | A | B | B | B | A | A |
| 45 | 0.3 | 40 | 20 | A | A | A | A | A | A |
| 46 | 0.3 | 10 | 25 | B | A | A | A | A | A |
| 47 | 0.3 | 20 | 60 | B | A | A | A | A | A |
| 48 | 0.3 | 40 | 70 | B | A | A | A | A | A |
| 49 | 0.3 | 80 | 75 | B | A | A | A | A | A |
| 50 | 0.4 | 0 | 0 | — | D | D | D | D | D |
| 51 | 0.4 | 0 | 5 | — | B | B | B | B | B |
| 52 | 0.4 | 0 | 20 | — | A | A | A | A | A |
| 53 | 0.4 | 0 | 50 | — | A | A | A | A | A |
| 54 | 0.4 | 0 | 70 | — | A | A | A | A | A |
| 55 | 0.4 | 0 | 100 | — | A | A | B | B | B |
| 56 | 0.4 | 0 | 200 | — | B | B | B | B | C |
| 57 | 0.4 | 0 | 300 | — | C | C | C | D | D |
| 58 | 0.4 | 0 | 500 | — | D | C | D | D | D |

Fine particle A is a mixture of Tospar 103 and Tospar 130 (50:50) each produced by Toshiba Silicone Co., Ltd., and fine particle B is Tospar 120.

Example 5

(Sample No. 59)

Sample No. 59 was prepared in the same manner as in Sample No. 23, except that the fine particles of the image protective layer were changed to functional group-containing fine particles FX-GSZ-07 (Lot No. 5107, produced by Nihon Shokubai Co., Ltd.) and evaluated in the same manner as in Sample No. 23.

(Sample No. 60)

Sample No. 60 was prepared in the same manner as in Sample No. 19, except that the following image forming layer was used and evaluated in the same manner as in Sample No. 19.

(Sample No. 61)

Sample No. 61 was prepared in the same manner as in Sample No. 46, except that the image forming layer of Sample No. 60 was used and evaluated in the same manner as in Sample No. 46.

The results are shown in Table 5.

TABLE 5

| Sample No. | Colorant layer | Fine particles | Exposure amount | Stain | Resolving power | Solvent resistance | Anti-abrasion |
|---|---|---|---|---|---|---|---|
| 23 | P-1 | B | A | B | B | B | B |
| 59 | P-1 | C | A | A | A | A | A |
| 52 | P-1 | — | A | A | A | A | A |
| 60 | P-2 | — | B | B | B | B | B |
| 19 | P-1 | B | A | A | A | A | A |
| 61 | P-2 | B | B | B | B | B | B |

Example 6

(Sample No. 62)

Sample No. 62 was prepared in the same manner as in Sample No. 6 of Example 1, except that polyisocyanate (Colonate L made by Nihon Polyurethane Kogyo Co., Ltd.) was not added to the image forming layer, and evaluated in the same manner as in sample No. 6.

(Sample No. 63)

Sample No. 63 was prepared in the same manner as in Sample No. 37, except that the binder resin of the image forming layer was changed to a saturated polyester resin, Bilon 200 (with a glass transition temperature of 67° C.) and evaluated in the same manner as in Sample No. 37.

(Sample No. 64)

Sample No. 64 was prepared in the same manner as in Sample No. 37, except that the following image protective layer was used and evaluated in the same manner as in Sample No. 37.

-Image protective layer-

| | |
|---|---|
| Saturated Polyester binder aqueous dispersion (Solid content: 34%) (Bilonal MD1200 with a glass transition temperature of 67° C. made by Toyobo Co., Ltd.) | 10 parts |
| Silicone fine particles (Tospar 108, average particle size: 2.0 μm) | adjusted to be 35 mg/m² |
| Pure water | 24 parts |

The results are shown in Table 6.

TABLE 6

| Sample No. | Har- dener | Coating solvent | Ex- posure amount | Stain | Re- solving power | Solvent resistance | Anti- abrasion |
|---|---|---|---|---|---|---|---|
| 6 | Yes | Organic solvent | A | A | A | A | A |
| 62 | None | Organic solvent | A | A | A | B | B |
| 63 | Yes | Organic solvent | A | B | B | A | A |
| 64 | None | Water | B | B | B | B | B |

Example 7

The image forming material sample Nos. 65 through 76 (corresponding to sample Nos. 1 through 12 before laminating an image receiving layer, respectively) were prepared, except that the fine particle content of the image protective layer was changed as shown in Table 7, and were imagewise scanning exposed from the support side, focused on the surface of the image forming layer using a semiconductor laser (LT090MD, main wavelength: 830 nm, produced by Sharp Co., Ltd.), whereby adhesion between the image forming layer and the support was reduced at exposed portions, and an adhesive tape Scotch mending tape made by Sumitomo 3M Co., Ltd.) was adhered to the image forming layer and then separated from the image forming layer to form an image. The evaluation was carried out in the same manner as in Example 1. The results are shown in Table 7.

TABLE 7

| Sample No. | Thickness d (μm) | Fine particle content mg/m² | Average particle size r (μm) | r ≧ d | Exposure amount | Stain | Resolving power | Solvent resistance | Anti- abrasion |
|---|---|---|---|---|---|---|---|---|---|
| 65 | 0.00 | 0 | 0.0 | D | D | D | D | D | D |
| 66 | 0.02 | 40 | 2.0 | B | A | C | C | D | D |
| 67 | 0.03 | 40 | 2.0 | B | A | B | B | B | B |
| 68 | 0.05 | 40 | 2.0 | B | A | B | B | B | B |
| 69 | 0.1 | 40 | 2.0 | B | A | A | A | A | A |
| 70 | 0.2 | 40 | 2.0 | B | A | A | A | A | A |
| 71 | 0.3 | 40 | 2.0 | B | A | A | A | A | A |
| 72 | 0.5 | 40 | 2.0 | B | A | B | B | A | A |
| 73 | 0.8 | 40 | 2.0 | B | B | B | B | A | A |
| 74 | 1.0 | 40 | 2.0 | B | B | B | B | A | A |
| 75 | 1.5 | 40 | 2.0 | B | D | C | D | A | A |
| 76 | 2.0 | 40 | 2.0 | B | D | D | D | A | A |

Example 8

The image forming material material sample Nos. 77 through 88 were prepared in the same manner as in sample Nos. 65 through 76 of Example 7, respectively, except that the hardener of the image forming layer was not used. The evaluation was carried out in the same manner as in Example 1.

The results are shown in Table 8.

TABLE 8

| Sample No. | Thickness d (μm) | Fine particle content mg/m² | Average particle size r (μm) | r ≧ d | Exposure amount | Stain | Resolving power | Solvent resistance | Anti- abrasion |
|---|---|---|---|---|---|---|---|---|---|
| 77 | 0.00 | 0 | 0.0 | D | D | D | D | D | D |
| 78 | 0.02 | 40 | 2.0 | B | A | C | C | D | D |

TABLE 8-continued

| Sample No. | Thickness d (μm) | Fine particle content mg/m² | Average particle size r (μm) | r ≧ d | Exposure amount | Stain | Resolving power | Solvent resistance | Anti-abrasion |
|---|---|---|---|---|---|---|---|---|---|
| 79 | 0.03 | 40 | 2.0 | B | A | B | B | B | B |
| 80 | 0.05 | 40 | 2.0 | B | A | B | B | B | B |
| 81 | 0.1 | 40 | 2.0 | B | A | A | A | B | B |
| 82 | 0.2 | 40 | 2.0 | B | A | A | A | B | B |
| 83 | 0.3 | 40 | 2.0 | B | A | A | A | B | B |
| 84 | 0.5 | 40 | 2.0 | B | A | B | B | B | B |
| 85 | 0.8 | 40 | 2.0 | B | B | B | B | B | B |
| 86 | 1.0 | 40 | 2.0 | B | B | B | B | B | B |
| 87 | 1.5 | 40 | 2.0 | B | D | C | D | B | B |
| 88 | 2.0 | 40 | 2.0 | B | D | D | D | B | B |

Example 9

The inventive and comparative image forming material samples were prepared using the following support, image forming layer and image receiving material.

-Support-

A 100 μm transparent polyethylene terephthalate film T100G (produced by Diafoil Hoechst Co., Ltd.) was subjected to corona discharge on the image forming layer side to obtain a support.

-Image forming layer-

The following composition was kneaded with an open kneader to obtain an image forming layer coating solution containing an inorganic metal compound. The resulting coating solution was coated on the support by an extrusion coating method, dried, subjected to calender treatment and cured at 60° C. for 72 hours to give a hardened image forming layer having a dry thickness of 1.3 μm.

| | |
|---|---|
| Fe—Al ferromagnetic metal powder | 100 parts |
| (Fe:Al ratio in number of atoms:overall average = 100:4, surface layer = 50:50, average major axial length = 0.14 μm, Hc:1760 ersted, σs:120 emu/g, BET value = 53 m²/g) | |
| Polyvinyl chloride resin MR105 | 10 parts |
| (made by Nippon Zeon Co., Ltd.) | |
| Polyurethane resin UR8700 | 10 parts |
| (made by Toyoboseki Co., Ltd.) | |
| α-Alumina (average particle size: 0.15 μm) | 8 parts |
| Carbon black (average particle size: 0.04 μm) | 0.5 parts |
| Stearic acid | 1.0 part |
| Butyl stearate | 1.0 part |
| Polyisocyanate (Colonate L made by Nihon Polyurethane Kogyo Co., Ltd.) | 5.0 parts |
| Cyclohexanone | 100 parts |
| Methyl ethyl ketone | 100 parts |
| Toluene | 100 parts |

-Image protective layer-

The image protective layer used in Sample No. 5 of Example 1 was provided on the above image forming layer.

-Image receiving material-

Thereafter, Polyester sheet No. 595 made by Nichiban Co., Ltd. as an image receiving material was superposed on the image forming layer to face an adhesion layer of the image receiving material, and the resulting material was subjected to air-tight pressure treatment using a pressure roller (transport speed: 30 mm/second, applied pressure: 3.0 kg/cm). Thus, the image receiving material was laminated on the image forming layer to obtain an image forming material.

<Image forming method>

The above obtained image forming material was imagewise scanning exposed from the support side, focused on the image forming layer surface using a semiconductor laser (LT090MD, main wavelength: 830 nm, produced by Sharp Co., Ltd.). Thereafter, the support of the resulting material was fixed on a plate and then, the image receiving material was separated from the image forming layer (at a peeling angle of 180° and at a peeling speed of 40 mm/second). Thus, exposed portions, at which adhesion between the support and the image forming layer was reduced by the imagewise exposure, were transferred to the image receiving material to form an image.

Example 10

Image was formed in the same manner as in Example 9, except that cello tape No. 406 produced by Nichiban Co., ltd. was used as an image receiving material.

Example 11

Image was formed in the same manner as in Example 9, except that an image receiving material and image forming method were changed as follows:

-Image receiving material-

The following adhesion layer coating solution was coated on a support, a 100 μm transparent polyethylene terephthalate film S-100 (produced by Diafoil Hoechst Co., Ltd.), and dried to obtain an image adhesion layer having a dry thickness of 15.0 μm. Thus, an image receiving material was obtained. The image receiving material was superposed on the image forming layer to face the adhesion layer, and the resulting material was subjected to air-tight pressure treatment using a pressure roller (transport speed: 30 mm/second, applied pressure: 3.0 kg/cm, and applied temperature: 40° C.). Thus, the image receiving material was laminated on the image forming layer to obtain an image forming material.

| | |
|---|---|
| Ethylene-ethylacrylate copolymer | 3.6 parts |
| (Evaflex A-715, produced by Mitsui Dupont Polychemical Co., Ltd.) | |
| Toluene | 90 parts |
| Methylethyl ketone | 6.4 parts |

<Image forming method>

The above obtained image forming material was imagewise scanning-exposed from the support side, focused on the image forming layer surface using a semiconductor laser (LT090MD, main wavelength: 830 nm, produced by Sharp Co., Ltd.). The resulting material was subjected to heat and pressure treatment using a pressure roller (transport speed: 30 mm/second, applied pressure: 3.0 kg/cm, applied temperature 100° C.), fixed on a plate to contact the support, and then, the image receiving material was separated from the image forming layer (at a peeling angle of 180° and a peeling speed of 40 mm/second). Thus, exposed portions, at which adhesion between the support and the image forming layer was reduced by the imagewise exposure, were transferred to the image receiving material to form an image.

Example 12

An image was formed in the same manner as in Example 9, except that the image receiving material was changed as follows:
-Image receiving material-
The following adhesion layer coating solution was coated on a support, a 25 μm transparent polyethylene terephthalate film S-100 (produced by Diafoil Hoechst Co., Ltd.), and dried to obtain an image adhesion layer having a dry thickness of 15.0 μm. Thus, an image receiving material was obtained. The image receiving material was superposed on the image forming layer to face the adhesion layer, and the resulting material was subjected to air-tight pressure treatment using a pressure roller (transport speed: 30 mm/second, applied pressure: 3.0 kg/cm, applied temperature: 40° C.). Thus, the image receiving material was laminated on the image forming layer to obtain an image forming material.

| | |
|---|---|
| Ethylene-ethylacrylate copolymer (Evaflex A-709, produced by Mitsui Dupont Polychemical Co., Ltd.) | 3.6 parts |
| Toluene | 90 parts |
| Cyclohexanone | 6.4 parts |

Example 13

Image was formed in the same manner as in Example 9, except that the image receiving material was changed as follows:
-Image receiving material-
The following adhesion layer coating solution was coated on a support, a 25 μm transparent polyethylene terephthalate film S-100 (produced by Diafoil Hoechst Co., Ltd.) and dried to obtain an adhesion layer having a dry thickness of 25.0 μm. Thus, an image receiving material was obtained. The image receiving material was superposed on the image forming layer to face the adhesion layer, and the resulting material was subjected to air-tight pressure treatment using a pressure roller (transport speed: 30 mm/second, applied pressure: 3.0 kg/cm, applied temperature: 40° C.). Thus, the image receiving material was laminated on the image forming layer.

| | |
|---|---|
| Ethylene-ethylacrylate copolymer (Evaflex EV-40Y, produced by Mitsui Dupont Polychemical Co., Ltd.) | 3.6 parts |
| Toluene | 90 parts |
| Cyclohexanone | 6.4 parts |

Example 14

An image was formed in the same manner as in Example 9, except that the image receiving material was changed as follows:
-Image receiving material-
The following adhesion layer coating solution was coated onto a support, a 38 μm transparent polyethylene terephthalate film T-100 (produced by Diafoil Hoechst Co., Ltd.), and dried to obtain an adhesion layer having a dry thickness of 0.6 μm. Thus, an image receiving material was obtained. The image receiving material was superposed on the image forming layer to face the adhesion layer, and the resulting material was subjected to air-tight pressure treatment using a pressure roller (transport speed: 30 mm/second, applied pressure: 3.0 kg/cm, applied temperature: 110° C.), whereby the image receiving material was laminated onto the image forming layer.

| | |
|---|---|
| Polyurethane resin Nipolane 3116, solid content: 20.9% (produced by Nihon Polyurethan Kogyo Co., Ltd.) | 3.0 parts |
| Toluene | 90 parts |
| Cyclohexanone | 7.0 parts |

Samples prepared in Examples 9 through 14 above were evaluated according to the following items:
<Peeling force>
The peeling force at unexposed portions between the image forming layer and the image receiving material was measured by a 180° peeling method according to JIS C 2107 (JIS Z 0237).
-Resolving power-
The imagewise scanning exposure was carried out to form an image at an average exposure amount, at a scanning pitch of 8 μm, with a light having a 4 μm beam diameter, and resolving power of the formed image was evaluated in terms of line numbers N per 1 mm, which are resolved, according to the following four stages:

A: $125 = N$

B: $120 \leq N < 125$

C: $110 \leq N < 120$

D: $N < 110$

-Remaining image density-
The imagewise exposure was carried out to form a solid image of 0.5 mm×0.5 mm by scanning-exposing with a light having a 4 μm beam diameter, and an optical density, visual light density (OD: measured transmittance density minus transmittance of the support) at exposed portions was measured using a densitometer (X-rite 310Tr produced by X-rite Co., Ltd.) and evaluated according to the following four stages:

A: $OD \leq 0.060$

B: $0.060 < OD \leq 0.100$

C: $0.100 < OD \leq 0.250$

D: $0.250 < OD$

-Sensitivity-
The average exposure amount (E1, mJ/cm$^2$) on the image forming layer surface necessary to form a solid image of 0.5 mm×0.5 mm by scanning-exposing with a light having a 4 μm beam diameter was measured, and sensitivity was evaluated according to the following four stages:

A: $E \leq 250$

B: $250 < E \leq 400$

C: $400 < E \leq 600$

D: $600 < E$

<Damage of support>
The degree (elongation or curl) of damage of the support after the exposure and separation for forming an image was observed and evaluated according to the following criteria:

A: No change

B: Slight curl

C: Apparent elongation and curl, but not recovered in the plane form

<Handling property>

Handling property of the sample was evaluated according to the following method.

The sample was curved at a radius of curvature of R with the image receiving material side being concave, and evaluated according to the following criteria:

A: When R was 50 cm, the image receiving material did not separate from the image forming material and presented no problem in handling.

B: When R was 50 cm, the image receiving material separated from the image forming material.

C: On handling the sample, the image receiving material separated from the image forming material.

The results are collectively shown in Table:

TABLE 9

| | Peeling force (gf/cm) | Resolving power | Remaining image density | Sensitivity | Damage of support | Handling property |
|---|---|---|---|---|---|---|
| Ex. 9 | 25 | B | B | B | B | B |
| Ex. 10 | 1230 | A | C | C | C | B |
| Ex. 11 | 14 | B | A | B | B | B |
| Ex. 12 | 35 | A | B | B | B | B |
| Ex. 13 | 500 | B | C | B | B | B |
| Ex. 14 | 3 | A | A | A | B | B |

Ex. represents Example

Example 15

<Preparation of support>

SPS pellets were manufactured according to a method disclosed in Japanese Patent O.P.I. Publication No. 3-131843/1991. All the operations from catalyst preparation to polymerization were carried out in the argon atmosphere. 17.8 g (71 mmol) of cupric sulfate pentahydrate ($CuSO_4 \cdot 5H_2O$), 200 ml of purified benzene and 24 ml of trimethyl aluminium were put in a 500 ml glass vessel, and agitated at 40° C. for eight hours to prepare a catalyst. After this was filtered with glass filter of No. 3A in the argon atmosphere, and the filtered solution was freeze-dried. Then, the produced material was taken out and the produced material, tributyl aluminium and pentamethylcyclopentadienyl titanium trimethoxide were put into a stainless reaction vessel having the inner volume of 2 liters, and heated to 90° C.

Then, 1 liter of purified styrene and 70 ml of purified methylstyrene were added to this and the mixture was subjected to polymerization reaction at this temperature for 8 hours. Thereafter, the resulting mixture was cooled to room temperature and one liter of methylene chloride was added, and a methanol solution of sodium methylate was added under agitation to deactivate the catalyst. After the mixture was added dropwise gradually into 20 liters of methanol, the precipitation was filtered with a glass filter and washed with methanol for three times, and dried. The weight average molecular weight measured by GPC using 1,2,4-trichlorobenzene as a solvent was 415,000 in terms of standard polystyrene. The above obtained polymer had a melting point of 245° C. and had a syndiotactic structure from a carbon thirteen NMR measurement at 135° C.

This polymer was extruded by an extruding machine to make pellets and dried at 130° C.

The above obtained SPS pellets were melted, extruded at 330° C. by an extruder, and extruded on a cooled casting drum from a die-slit while applying electrostatic potential and cooled. Thus, an unoriented 1000 μm thick SPS sheet was obtained.

The resulting sheet was heated to 115° C. and firstly oriented in the longitudinal direction with an orientation magnification degree of 3.3 times, and the resulting sheet was pre-heated to 115° C. and further oriented at 135° C. in the lateral direction with the orientation magnification degree of 3.3 times. The resulting sheet was heat set at 225° C. while relaxing in the lateral direction. Thus, a 100 μm thick SPS film was obtained.

The surface of the thus obtained SPS film were subjected to a 23 $W/m^2$ minute corona discharge treatment, and an ion wind was blown. Thus, an SPS support was obtained. The image forming material sample was prepared in the same manner as in Sample No. 5 of Example 1, except that this SPS support was used instead of a polyethylene terephthalate support, and evaluated in the same manner as in Example 1.

This sample provided an image with excellent durability and high quality like Sample No. 5 of Example 1.

Example 16

The image forming material sample Nos. 95 through 125 were prepared in the same manner as in Example 1, except that in the image protective layer, the binder resin was changed to those as shown in Table 10, the hardener was changed to another isocyanate compound, Colonate HX produced by Nihon Polyurethane Co., Ltd., the fine particles were changed to a silica, Nipsil (having an average particle size 1.5 μm) produced by Nihon Silica Kogyo Co., Ltd. and the fine particle content was 4 $mg/m^2$, and evaluated for resolving power and anti-abrasion in the same manner as in Example 1.

TABLE 10

| Sample No. | Binder in protective layer | | | Resolving power | Anti-abrasion |
|---|---|---|---|---|---|
| | Kinds | Product name and maker | Tg | | |
| 95 | acryl resin | Dianar BR-101; Mitsubishi Rayon Co., Ltd. | 50 | C | B |
| 96 | vinyl chloride resin | VYHH; Union Carbide Co., Ltd. | 72 | B | B |
| 97 | acryl resin | Dianar BR-77; Mitsubishi Rayon Co., Ltd. | 80 | A | A |
| 98 | acryl resin | Dianar BR-95; Mitsubishi Rayon Co., Ltd. | 80 | A | A |
| 99 | polyester resin | Bilon UR-1400; Toyo boseki Co., Ltd. | 83 | A | A |
| 100 | polyvinyl acetal resin | Eslec BX-1; Sekisuikagaku Kogyo Co., Ltd. | 86 | A | A |
| 101 | polyvinyl acetal resin | Eslec BX-2; Sekisuikagaku Kogyo Co., Ltd. | 87 | A | A |
| 102 | polyvinyl acetal resin | Eslec BX-5; Sekisuikagaku Kogyo Co., Ltd. | 89 | A | A |
| 103 | polyester resin | Eliter UE-3690; Unichica Co., Ltd. | 90 | A | A |
| 104 | acryl resin | Dianar BR-75; Mitsubishi Rayon Co., Ltd. | 90 | A | A |
| 105 | acryl resin | Dianar BR-55; Mitsubishi Rayon Co., Ltd. | 92 | A | A |
| 106 | phenoxy resin | Phenoart YP-50; Totokasei Co., Ltd | 94 | A | A |

TABLE 10-continued

| Sample No. | Binder in protective layer Kinds | Product name and maker | Tg | Resolving power | Anti-abrasion |
|---|---|---|---|---|---|
| 107 | phenoxy resin | Phenoart YP-50S; Totokasei Co., Ltd | 94 | A | A |
| 108 | acryl resin | Dianar BR-82; Mitsubishi Rayon Co., Ltd. | 95 | A | A |
| 109 | acryl resin | Dianar BR-50; Mitsubishi Rayon Co., Ltd. | 100 | A | A |
| 110 | acryl resin | Dianar BR-73; Mitsubishi Rayon Co., Ltd. | 100 | A | A |
| 111 | phenoxy resin | PKHC; Union Carbide Co., Ltd. | 100 | A | A |
| 112 | phenoxy resin | PKHH; Union Carbide Co., Ltd. | 100 | A | A |
| 113 | phenoxy resin | PKHJ; Union Carbide Co., Ltd. | 100 | A | A |
| 114 | acryl resin | Simac US-270; Toa Gosei Co., Ltd. | 100 | B | A |
| 115 | acryl resin | Dianar BR-52; Mitsubishi Rayon Co., Ltd. | 105 | A | A |
| 116 | acryl resin | Dianar BR-80; Mitsubishi Rayon Co., Ltd. | 105 | A | A |
| 117 | acryl resin | Dianar BR-83; Mitsubishi Rayon Co., Ltd. | 105 | A | A |
| 118 | acryl resin | Dianar BR-85; Mitsubishi Rayon Co., Ltd. | 105 | A | A |
| 119 | acryl resin | Dianar BR-87; Mitsubishi Rayon Co., Ltd. | 105 | A | A |
| 120 | acryl resin | Dianar BR-88; Mitsubishi Rayon Co., Ltd. | 105 | A | A |
| 121 | acryl resin | Dianar BR-100; Mitsubishi Rayon Co., Ltd. | 105 | A | A |
| 122 | acryl resin | Dianar BR-108; Mitsubishi Rayon Co., Ltd. | 108 | A | A |
| 123 | polyvinyl acetal resin | Eslec KS-1; Sekisuikagaku Kogyo Co., Ltd. | 110 | A | A |
| 124 | polyvinyl acetal resin | Eslec KS-5Z; Sekisuikagaku Kogyo Co., Ltd. | 110 | A | A |
| 125 | polycarbonate | Yupilon Z-200; MITSUBISHI GAS CHEMICAL CO., INC | 134 | A | A |

Example 17

The image forming material sample Nos. 143 through 160 were prepared in the same manner as in sample No. 5 of Example 1, except that the binder resin and solvent of the image protective layer coating solution were changed to those as shown in Table 11, and the solution was coated using a wire bar at a coating pressure greater than the weight of the wire bar, and the surface of the resulting image forming layer (coatability) was evaluated according to the following criteria:

A: No scratches
B: Scratches on the surface but not so deep
C: Not more than 5 mm deep Scratches
D: A large number of scratches

TABLE 11

| Sample No. | | Binder in protective layer | Maker | Solvent | Image forming layer | Coatability |
|---|---|---|---|---|---|---|
| 126 | Example | UE-3690 | Unichika Co., Ltd. | MEK, CYC | Before hardening | C |
| 127 | Example | PKHC | Union Carbide Co., Ltd. | MEK, Tol., CYC | Before hardening | C |
| 128 | Example | PKHH | Union Carbide Co., Ltd. | MEK, Tol., CYC | Before hardening | C |
| 129 | Example | PKHJ | Union Carbide Co., Ltd. | MEK, Tol., CYC | Before hardening | C |
| 130 | Example | YP-50 | Totokasei Co., Ltd. | MEK, Tol., CYC | Before hardening | C |
| 131 | Example | US-270 | Toa Gosei Co., Ltd. | MEK | Before hardening | B |
| 132 | Example | KS-1 | Sekisuikagaku Kogyo Co., Ltd. | MEK, EtOH | Before hardening | B |
| 133 | Example | BR-77 | Mitsubishi Rayon Co., Ltd. | Tol. | Before hardening | B |
| 134 | Example | BR-87 | Mitsubishi Rayon Co., Ltd. | Tol. | Before hardening | B |
| 135 | Example | UE-3690 | Unichika Co., Ltd. | MEK, CYC | After hardening | A |
| 136 | Example | PKHC | Union Carbide Co., Ltd. | MEK, Tol., CYC | After hardening | A |
| 137 | Example | PKHH | Union Carbide Co., Ltd. | MEK, Tol., CYC | After hardening | A |
| 138 | Example | PKHJ | Union Carbide Co., Ltd. | MEK, Tol., CYC | After hardening | A |
| 139 | Example | YP-50 | Totokasei Co., Ltd. | MEK, Tol., CYC | After hardening | A |
| 140 | Example | US-270 | Toa Gosei Co., Ltd. | MEK | After hardening | A |
| 141 | Example | KS-1 | Sekisuikagaku Kogyo Co., Ltd. | MEK, EtOH | After hardening | A |
| 142 | Example | BR-77 | Mitsubishi Rayon Co., Ltd. | Tol. | After hardening | A |
| 143 | Example | BR-87 | Mitsubishi Rayon Co., Ltd. | Tol. | After hardening | A |

MEK: Methylethyl ketone, CYC: Cyclohexanone, Tol.: Toluene, EtOH: Ethanol

Example 18

The image forming material sample Nos. 161 through 168 were prepared in the same manner as in sample No. 5 of Example 1, except that the solvent of the image forming layer coating solution, and the binder resin and solvent of the image protective layer coating solution were changed to those as shown in Table 12. In the Samples using gelatin as a protective layer binder, carbodiimide, carbodilite V-02 produced by Nisshin Boseki Co., Ltd. was used as a hardener instead of the isocyanate compound. The resulting materials were evaluated for anti-abrasion in the same manner as in Example 1 and were also evaluated for adhesion between the image protective layer and image forming layer. The adhesion was evaluated as follows:

<Adhesion evaluation>

The surface of the image protective layer was scratched with an eraser to reach the surface of the image forming layer so that 100 squares were formed by 11×11 lines, and cellophane tape, produced by Nichiban Co., Ltd., was adhered to the 100 squares and the adhered tape was quickly peeled from the image protective layer at an angle of 90°. The degree of adhesion was evaluated according to the number of squares peeled off.

TABLE 12

| Sample No. | | Solvent in image forming layer | Binder in image protective layer | Solvent in image protective layer | Adhesion | Anti-abrasion |
|---|---|---|---|---|---|---|
| 144 | Example | MEK, Tol. | Gelatin | Water | C | B |
| 145 | Example | MEK, Tol. | PKHH | ACT, THF | B | C |
| 146 | Example | MEK, Tol. | PKHH | MEK | A | A |
| 147 | Example | MEK, Tol. | PKHH | MEK, Tol. CYC | A | A |
| 148 | Example | MEK, Tol. CYC | Gelatin | Water | C | B |
| 149 | Example | MEK, Tol. CYC | PKHH | Water | B | C |
| 150 | Example | MEK, Tol. CYC | PKHH | MEK | A | A |
| 151 | Example | MEK, Tol. CYC | PKHH | MEK, Tol. | A | A |

ACT: Acetone, THF: Tetrahydrofurane
A: Not more than 5
B: Six to twenty
C: Twenty-one to fifty
D: Not less than 51

The results are shown in Table 14.

What is claimed is:

1. An image forming material comprising a support and provided thereon, an image forming layer and a hardened image protective layer in that order, the image forming layer containing a colorant and a first binder resin, and the image protective layer containing fine particles in an amount of 2 to 150 mg/m² and a second binder resin and having a thickness of 0.03 to 1.0 μm, said fine particles having an average particle size r of 0.3 to 4.5 μm, and the average particle size r and the thickness of d of the image protective layer satisfy the following relation:

$$r > d$$

a surface of said protective layer opposite said image forming layer is roughened, wherein an image is formed by exposing the material to a high density energy light to reduce adhesion between the image forming layer and the support and then removing the image forming layer at exposed portions.

2. The image forming material of claim 1, wherein the colorant is metal atom-containing fine particles.

3. The image forming material of claim 1, wherein the second binder resin of the image protective layer is a resin having a glass transition temperature of 80° to 200° C.

4. The image forming material of claim 1, wherein the image forming layer is hardened with a hardener.

5. The image forming material of claim 1, wherein the support is consisting of a styrene homopolymer or copolymer having a syndiotactic structure.

6. The image forming material of claim 1, wherein an image receiving material is further provided on the image protective layer.

7. An image forming material comprising a support, an image forming layer containing a colorant and a first binder resin, a hardened image protective layer, and an image receiving material in that order, said image protective layer having a thickness d of 0.03 to 1.0 μm and containing 2 to 150 mg/m² of fine particles with an average particle size r of 0.3 to 4.5 μm and a second binder resin, r and d satisfying the following relation:

$$r > d$$

wherein a surface of said image protective layer on said image receiving material side is roughened to a smoother value of 1 to 200 mmHg at 23° C. and 55% RH, and wherein an image is formed by exposing said image forming material to a high density energy light to reduce adhesion between said image forming layer and said support, and then removing said image forming layer at exposed portions.

* * * * *